(12) United States Patent
Yamada

(10) Patent No.: US 12,290,990 B2
(45) Date of Patent: May 6, 2025

(54) RF AND mmWave CIRCUITS AND THEIR FABRICATION METHODS

(71) Applicant: Nano Dimension Technologies LTD., Nes Ziona (IL)

(72) Inventor: Minoru Yamada, Kowloon (HK)

(73) Assignee: Nano Dimension Technologies, LTD, Nes Ziona (IL)

( * ) Notice: Subject to any disclaimer, the term of this patent is extended or adjusted under 35 U.S.C. 154(b) by 0 days.

(21) Appl. No.: 18/712,495

(22) PCT Filed: Nov. 22, 2021

(86) PCT No.: PCT/US2021/060241
§ 371 (c)(1),
(2) Date: May 22, 2024

(87) PCT Pub. No.: WO2023/091146
PCT Pub. Date: May 25, 2023

(65) Prior Publication Data
US 2024/0326342 A1    Oct. 3, 2024

Related U.S. Application Data

(60) Provisional application No. 63/116,183, filed on Nov. 20, 2020.

(51) Int. Cl.
*B29C 64/393* (2017.01)
*B29C 64/112* (2017.01)
(Continued)

(52) U.S. Cl.
CPC .......... *B29C 64/393* (2017.08); *B29C 64/112* (2017.08); *B29C 64/209* (2017.08); *B29C 64/236* (2017.08); *B33Y 10/00* (2014.12); *B33Y 30/00* (2014.12); *B33Y 40/20* (2020.01); *B33Y 50/02* (2014.12); *H05K 3/125* (2013.01); *H05K 3/4664* (2013.01); *B29K 2995/0005* (2013.01);
(Continued)

(58) Field of Classification Search
CPC ... B29C 64/112; B29C 64/393; H05K 3/1241; H05K 3/125; H05K 3/4664; H05K 3/0005; H01P 3/06; H01Q 13/103; H01Q 23/00; H04B 1/18
See application file for complete search history.

(56) References Cited

U.S. PATENT DOCUMENTS

| | | | |
|---|---|---|---|
| 7,411,472 B1 * | 8/2008 | West | H01Q 21/0093 342/368 |
| 10,571,642 B1 | 2/2020 | Cohen et al. | |

(Continued)

FOREIGN PATENT DOCUMENTS

| | | | | |
|---|---|---|---|---|
| KR | 2019199107 A1 | 10/2019 | | |
| WO | WO-2018140517 A1 * | 8/2018 | | B33Y 10/00 |
| WO | WO-2018164672 A1 * | 9/2018 | | B22F 1/0018 |

*Primary Examiner* — Seyed Masoud Malekzadeh
*Assistant Examiner* — Vipul Malik
(74) *Attorney, Agent, or Firm* — Guy Levi; The IP Law Firm of Guy Levi, LLC

(57) ABSTRACT

The disclosure relates to methods for forming MmWave RF (MMW) circuits in multilayered Additively Manufactured Electronics (AME). Specifically, the disclosure relates to methods for direct and/or indirect inkjet printing of reconfigurable and/or tunable RF and/or MMW AME circuit applications.

15 Claims, 3 Drawing Sheets

(51) Int. Cl.
    *B29C 64/209*     (2017.01)
    *B29C 64/236*     (2017.01)
    *B29L 31/34*     (2006.01)
    *B33Y 10/00*     (2015.01)
    *B33Y 30/00*     (2015.01)
    *B33Y 40/20*     (2020.01)
    *B33Y 50/02*     (2015.01)
    *H05K 3/12*     (2006.01)
    *H05K 3/46*     (2006.01)

(52) U.S. Cl.
    CPC ................ *B29L 2031/3425* (2013.01); *B29L 2031/3456* (2013.01)

(56) References Cited

U.S. PATENT DOCUMENTS

| | | | |
|---|---|---|---|
| 2018/0358711 A1* | 12/2018 | Henry | H01Q 9/0485 |
| 2020/0037451 A1 | 1/2020 | Elimelech et al. | |
| 2023/0261385 A1* | 8/2023 | He | H01Q 21/064 343/702 |

* cited by examiner

RF AND mmWave CIRCUITS AND THEIR FABRICATION METHODS

CROSS REFERENCE TO RELATED APPLICATIONS

This patent application is a U.S. National Phase filing of commonly owned and pending PCT Application No. PCT/US21/60241, filed Nov. 22, 2021, which is based on and claims the benefit of the filing date of now U.S. Provisional Patent Application Serial No. 63/116,183, filed Nov. 20, 2020, both which are incorporated herein by reference in their entirely.

BACKGROUND

The disclosure is directed to methods for forming mmWave RF circuits in multilayered Additively Manufactured Electronics (AME). Specifically, the disclosure is directed to methods for direct and/or indirect inkjet printing of reconfigurable and/or tunable mmWave RF AME circuit applications.

Electronic devices with small form factor are increasingly in demand in all areas where weight, size, cost and footprint impose stringent design constraints. These include, for example: manufacture, business, consumer goods, military, aeronautics, internet of things, and others. Products having these smaller form factors rely on compact electronic circuits with tightly spaced digital and analog circuits placed in close proximity. In many of these applications, the ability of antennas to tune resonances, change polarization and modify radiation patterns is a base requirement for proper functionality, such as direction finding, beam steering, radar, control and command; as well as variability in wireless standards, and emerging $5^{th}$ Generation (5G) and millimeter wave technologies; demand antennas with multifunctional abilities, i.e., antennas capable of remotely changing their characteristics dynamically, in reversible manner—and all within a very small packaging.

Furthermore, recent explosive attention of 5G spectrum increasingly demands more efficient fabrication methods that can construct consumer electronics with high accuracy, low cost and short production circle.

Likewise, mmWave (MMW) communication technology offers a vast array of high-speed capabilities, especially with the emergence of high-bandwidth-requirement data services such as, but not limited to, the transfer or downloading of uncompressed high definition (HD) TV data. The MMW band extends from about 28-300 GHz, which enables single or multichannel carrier signals capable of Gigabit transmission speeds.

The following disclosure addresses these needs.

SUMMARY

Disclosed, in various exemplary implementations, are methods for forming reconfigurable and/or tunable RF and/or MMW AME circuit applications in multilayered Additively Manufactured Electronics (AME). In another exemplary implementation, disclosed are examples and applications of methods for the direct and indirect inkjet printing of reconfigurable and/or tunable RF and/or MMW antennae in multilayered AME circuits.

In an exemplary implementation provided herein is a method of fabricating at least one of a radio-frequency (RF), and a MMW circuits comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") module including a central processing module (CPM), the CPM being in communication with each of the first, and second print heads, the CPM further comprising: at least one processor in communication with a non-transitory computer readable storage medium device to store instructions that, when executed by the at least one processor cause the CPM to control the ink-jet printing system, by carrying out steps that comprise: receiving a 3D visualization file representing the frequency pass filter (FPF); and generating a file library having a plurality of files, each file representing a substantially 2D layer for printing the at least one of: the RF, and the MMW circuits, and a metafile representing at least the printing order; providing the dielectric ink composition, and the conductive ink composition; using the CAM module, obtaining from the library a first file representative of the first layer for printing the at least one of: the RF, and the MMW circuits; the first file comprising printing instructions for a pattern representative of at least one of: the dielectric ink, and the conductive ink; using the first print head, forming the pattern corresponding to the dielectric ink; curing the pattern corresponding to the dielectric ink representation in the 2D layer of the multilayer PCB; using the second print head, forming the pattern corresponding to the conductive ink; sintering the pattern corresponding to the conductive ink; using the CAM module, obtaining from the a subsequent file representative of a subsequent layer for printing the at least one of: the RF, and the MMW circuits; the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon curing and/or sintering the final layer, at least one of: the RF, and the MMW circuits comprises: a first buried waveguide in in communication with a power amplifier (PA); a buried selector in communication with the first buried wave guide; an antenna, in communication with the selector; a second buried waveguide in in communication with the selector; a low noise amplifier (LNA) in communication with the second waveguide; and removing the substrate.

These and other features of the methods for direct and/or indirect inkjet printing of reconfigurable and/or tunable RF and/or MMW AME circuit applications, will become apparent from the following detailed description when read in conjunction with the figures and examples, which are exemplary, not limiting.

BRIEF DESCRIPTION OF THE FIGURES

For a better understanding of the methods for direct and/or indirect inkjet printing of reconfigurable and/or tunable RF and/or MMW AME circuit applications, with regard to the exemplary implementations, examples and applications thereof, reference is made to the accompanying examples and figures, in which.

DETAILED DESCRIPTION

Figure 1:
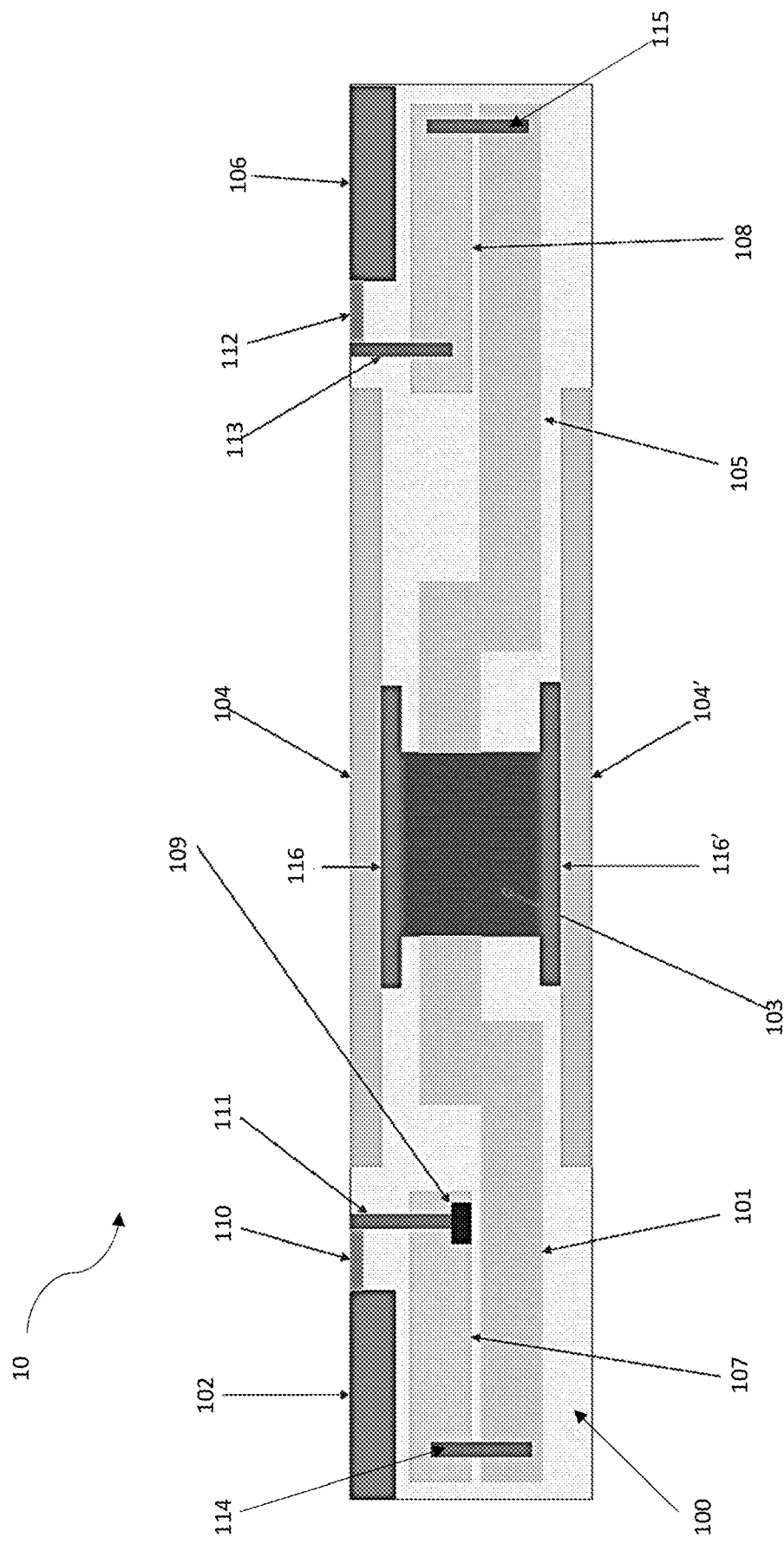
FIG. 1 illustrates a X-Z cross section of an exemplary implementation of the multilayered RF and/or MMW AME circuit fabricated using the disclosed methods.
Figure 2:
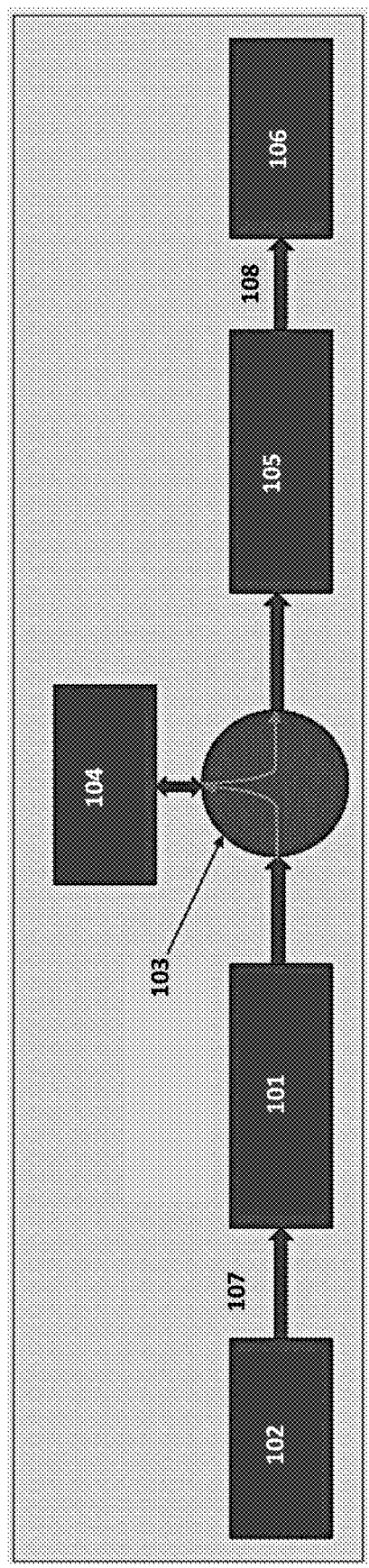
FIG. 2, illustrates a top plan view of the multilayered RF and/or MMW AME circuit illustrated in FIG. 1.

Provided herein are exemplary implementations of methods for direct and/or indirect inkjet printing of reconfigurable and/or tunable RF and/or MMW AME antennae in multilayered AME circuits. As used herein, AMEs, in the context of the disclosure, mean high-density interconnect (HDI) printed circuits, as well as low-temperature co-fired ceramic (LTCC), high-temperature co-fired ceramic (HTCC), and RF Integrated Passive Devices (IPD). A person skilled in the art of electronic circuits could also apply the exemplary implementations disclosed to multilayered printed circuit boards (PCBs) and flexible printed circuits (FPCs). Other circuits used in various applications requiring the multilayered RF and/or MMW AME circuits are likewise contemplated, such as for example, flexible near-field communication devices, microstrip antennae, array antennae and the like.

Provided herein are exemplary implementations and examples of additively manufactured transmission lines (TLs) and multi-layer RF and/or MMW AME antennae with tunable bandwidth. The multi-layered RF and/or MMW AME antennae 10 are composed of, for example (see e.g., FIG. 1) of first buried waveguide 101 in communication with power amplifier (PA) 102; buried selector 103 in communication with first buried wave guide 101; antenna 104, in communication with selector 103; second buried waveguide 105 in communication with selector 103; and low noise amplifier (LNA) 106 in communication with second buried waveguide 105.

In certain exemplary implementations, transmission line 110, 112 (in other words, lines that transmit electromagnetic (EM) signals from point to point), can be effectively a coaxial (e.g., shielded microstrip) transmission line, integral with the multilayered AME, forming an integral feeder structure that does not require external wiring or coupling to external components. Moreover, coaxial transmission lines 110, 112 can, in certain examples, be substantially circular in cross-section. In the context of the disclosure, the term 'coaxial' means the various layers/regions of transmission lines 110, 112 have a common propagation axis. In another example the layers/regions of transmission lines 110, 112 are fabricated such that upon the sintering and/or curing of the last printed layer file from the library, the layers/regions have the same geometric center. In certain examples, the transmission lines fabricated using the systems, methods and programs disclosed herein are coaxial and concentric, whereas in other examples; the transmission lines are not concentric. In addition, because of the fabrication method(s) disclosed herein, the transmission lines of certain examples are not limited to those circular in cross-section, rather, transmission lines with other cross-sections are contemplated, including but not limited to, rectangular and elliptical cross-sections. As used herein, the term "integral" is defined as molded, or otherwise formed, as a single unitary part of the multilayered AME.

In certain exemplary implementations, the methods described herein implementable in the systems described, can be used to form the multilayered AMEs with reconfigurable and/or tunable RF and/or MMW AME antennae array in a continuous, or semi-continuous process using an inkjet printing device in a single pass, or using several passes. In the semi-continuous process of the methods described herein, the base layer of dielectric material used to form the multilayered AME, is fabricated separately and can be provided as a substrate for further printing of the conductive and dielectric layers forming the reconfigurable and/or tunable RF and/or MMW AME antennae on top of it. Using the additive manufacturing printing methods described herein, it is possible to fabricate the reconfigurable and/or tunable RF and/or MMW AME antennae either semi-continuously or continuously.

In the context of the disclosure, the term "tunable", "tunable antenna", and/or their derivatives; refers to an antenna element or an array of elements, coupled to at least one tunable component. The tunable component may be, for example, at least one of: an RF switch, a voltage controlled tunable capacitor, a voltage controlled tunable phase shifter, a MEMS capacitor, a MEMS switch, a FET, a varactor diode, and a selector. Additionally, or alternatively, the tunable component may comprise any component capable of coupling with an antenna element and adjusting a reactance thereof.

In certain examples, the component capable of coupling with an antenna element and adjusting a reactance thereof, can be capacitor 109 integrated within the same multilayered AME and coupled directly without the need for external wiring. Accordingly, upon the sintering and/or curing of the last printed layer file from the library, provided herein is RF and/or MMW AME antenna structure comprising an antenna capacitor printed as a portion of the AME. The switching structure can be done by adding a biasing element, such as selector 103 coupled to the antenna's radiating element(s) 104, 104' (for example, radiating patches array, or slot array), which is spaced using the dielectric ink 100 with predetermined thickness. Furthermore, integrally printing at least one of: ground pads 116, 116', as well as integrally printed capacitor 109 and/or inductors 113-115 and inductors, are configured to effect variable reactive loads to the radiating elements 104, 104', thus better tuning and/or reconfiguration performance. Accordingly and in an exemplary implementation, the RF and/or MMW AME circuit further comprises an integrally printed capacitor 109, inductor(s) 113-115 sized and configured such that the RF and/or MMW AME antenna does not becomes a short circuit.

The systems, programs, methods and compositions described herein can be used to form/fabricate the multilayered RF and/or MMW AMEs with reconfigurable and/or tunable antennas (antennae), using a combination of print heads with conductive and dielectric ink compositions in a continuous or semi-continuous additive manufacturing process using inkjet printing device, or using several passes. Accordingly and in an exemplary implementation, provided herein is a method of fabricating at least one of a radiofrequency (RF), and a MMW circuits comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") module, in communication with each of the first, and second print heads, the CAM module further comprising a central processing module (CPM), whereby the CPM further comprising: at least one processor in communication with a non-transitory computer readable storage medium device to store instructions that, when executed by the at least one processor cause the CPM to control the ink-jet printing system, by carrying out steps that comprise: receiving a 3D visualization file representing the frequency pass filter (FPF); and generating a file library having a plurality of files, each file representing a substantially 2D layer for printing the at least one of: the RF, and the MMW circuits, and a metafile representing at least the printing order; providing the dielectric ink composition, and the conductive ink composition; using the CAM module, obtaining from the library a first file representative of the first layer for printing the at least one of: the RF, and the MMW circuits; the first file comprising printing instructions for a pattern representative of at least one of: the dielectric ink, and the conductive ink; using the first print head, forming the pattern corresponding to the dielectric ink; curing the pattern corresponding to the dielectric ink representation in the 2D layer of the multilayer PCB; using the second print head, forming the pattern corresponding to the conductive ink; sintering the pattern corresponding to the conductive ink; using the CAM module, obtaining from the a subsequent file representative of a subsequent layer for printing the at least one of: the RF, and the MMW circuits; the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon curing and/or sintering the final layer, at least one of: the RF, and the MMW circuits comprises: a first buried waveguide in communication with a power amplifier (PA); a buried selector in communication with the first buried wave guide; an antenna, in communication with the selector; a second buried waveguide in communication with the selector; and a low noise amplifier (LNA) in communication with the second buried waveguide; and removing the substrate.

In an exemplary implementation, the CPM is operable to generate, for each file representing the substantially 2D layer of dielectric ink pattern, to generate a sub library of conductive ink pattern files, each conductive ink pattern representing a substantially 2D layer for printing. Each of the sub library of files can further comprise a metafile with at least one of: an order of printing, an identifier of the file of substantially 2D layer of dielectric ink pattern it is associated with, and instructions on the speed of printing. It is noted, that the generated sub-library can comprise the number of files configured, once the final substantially 2D conductive ink pattern is sintered, to have the same thickness (or height) is the corresponding cured dielectric ink layer. For example, the sub-library can comprise between about 10 and about 55 files, each representing a substantial 2D layer of conductive ink for printing. In addition, the conductive ink pattern in each file can be identical, or at least one file can have a different pattern than another file in the sub library. Moreover, the thickness formed upon fabrication and sintering of the final substantially 2D conductive ink pattern, can be higher or lower than the surface of the cured substantially 2D layer of dielectric ink pattern printed. For example, in forming hollow vias, it may be desirable to raise the upper surface of the via above the dielectric layer thickness, to ensure electric contact between layers. Similarly, when forming wells for integrated circuit legs (J-legs), it may be advantageous to lower the conductive ink pattern below the surface of the dielectric ink layer.

The predetermined number of the blind via, and/or the buried via used in the systems, methods and compositions for fabricating the reconfigurable and/or tunable AME-based antennae disclosed herein, can be further sized configured to selectably (in other words, without affecting structure, steps or composition of unrelated components' operation and/or performance), couple each of radiating elements 104, 104' to transmission lines 110, 112, and/or to selector 103.

A more complete understanding of the components, methods, and devices disclosed herein can be obtained by reference to the accompanying drawings. These figures (also referred to herein as "FIG.") are merely schematic representations based on convenience and the case of demonstrating the present disclosure, and are, therefore, not intended to indicate relative size and dimensions of the devices or components thereof, their relative size relationship and/or to define or limit the scope of the exemplary implementations. Although specific terms are used in the following description for the sake of clarity, these terms are intended to refer only to the particular structure of the exemplary implementations selected for illustration in the drawings, and are not intended to define or limit the scope of the disclosure. In the drawings and the following description below, it is to be understood that like numeric designations refer to components of like function. Likewise, cross sections are referred to on normal orthogonal coordinate apparatus having XYZ axis, such that Y axis refers to front-to-back, X axis refers to side-to-side, and Z axis refers to up-and-down.

Figure 3:
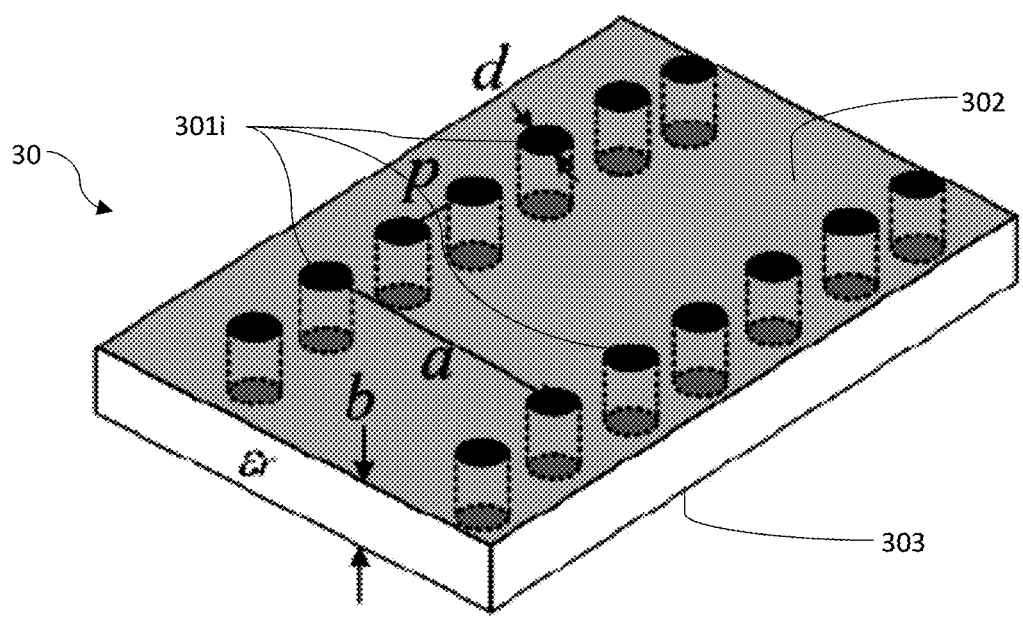
FIG. 3, is an illustration of a Post-wall waveguide.

As illustrated in FIG. 1, in the methods provided, using the disclosed systems and upon curing and/or sintering the final layer, the at least one of: first 101, and second 105 waveguides can be a Post-wall waveguide (see e.g., FIG. 3). The Post-wall waveguide can be comprised of buried vias forming the Poats-wall waveguide whereby, in reference now to FIG. 3, b, refers to the thickness of the waveguide in the Z direction, and minimum Z direction can be about 36 µm, p, the distance between the centers of the buried vias, can be about 300 µm, and d, the via diameter can be between about 100 µm and about 300 µm, while a, the width of the Post-wall waveguide can be modified.

Additionally, or alternatively, in the methods provided, using the disclosed systems and upon curing and/or sintering the final layer, the at least one of: first 101, and second 105 waveguides can be fully coaxial. As indicated, in the context of the first, and/or second buried waveguides, the term 'coaxial' means the various layers/regions of buried at least one of: first 101, and second 105 waveguides, means that at least one of: first 101, and second 105 waveguides each has a common propagation axis. In the context of the disclosure the term "buried" means the whole structure resides in an intermediate layer, while the term "fully" means the conductive sleeve forming a portion of the coaxial guidelines is continuous, rather than post-wall as illustrated in FIG. 3.

Figure 4:
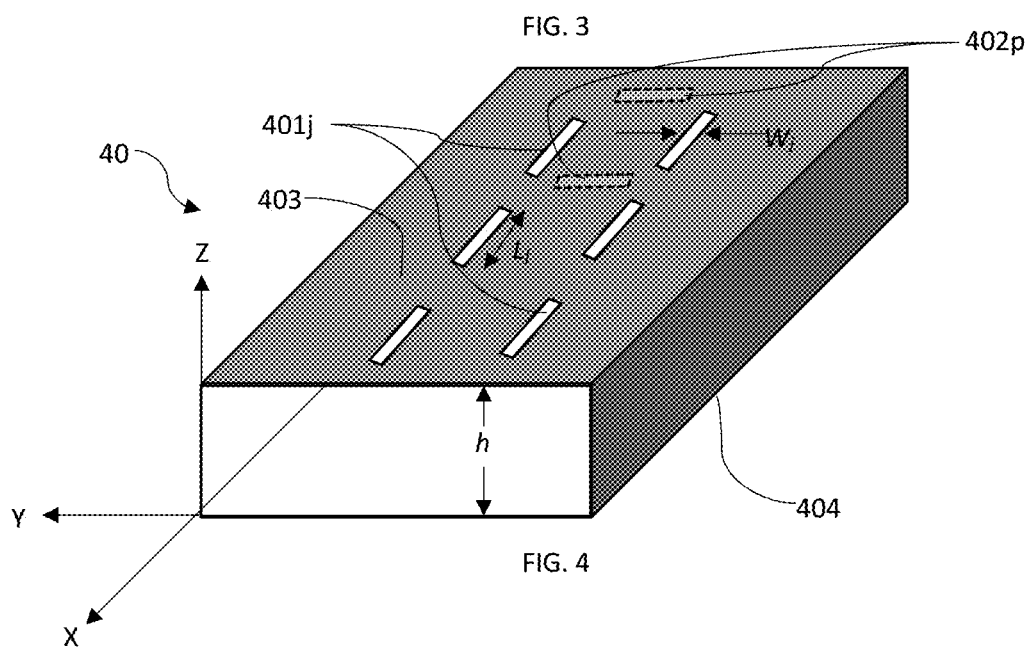
FIG. 4, is a schematic illustration of a slotted (waveguide) antenna.

Furthermore, upon curing and/or sintering the final layer in the methods disclosed using the systems and programs provided, antenna 104, 104' array can be a slot array antenna (see e.g., FIG. 4). Slits 401j are configured to have a width less than 0.1 of a wavelength) and 0.5 wavelengths long (at the center frequency of operation). While FIG. 4, illustrates slits 401j are oriented along the X axis, Slits oriented along the Y axis 402p are likewise contemplated.

Additionally, radiating antenna elements 104, 104' upon curing and/or sintering the final layer, be a patch array antenna, wherein the patches can be on the same surface, and/or stacked. In general, the impedance bandwidth of certain patch antennae, are typically proportional to the antenna volume, measured in wavelengths. However, by using a plurality of stacked patches (see e.g., 403, 404) with dielectric material 100 having predetermined thickness among the patches (with or without slots 401j, 402p), enhanced impedance bandwidth can be obtained. Accordingly and in an embodiment, the methods, compositions and systems disclosed herein can be configured to produce a large number of conductive layers in a single prototype, satisfying patch thickness-to-dielectric ink-volume ratio that will allow operation of the elements as antenna over wide bandwidth.

As illustrated in FIG. 1, upon curing and/or sintering the final layer, first buried waveguide 101 is in communication with buried power amplifier (PA) waveguide 107, whereby, buried PA waveguide 107 is coupled between first buried waveguide 101 and PA 102. In the context of the disclosure, the term "power amplifier" means any device or chain of devices that amplifies signals prior to radio transmission (i.e., at a transmitter) or following radio signal reception (i.e., at a receiver). For a receiver, the power amplifier can include low noise amplifier (LNA) 106, while for a transmitter, a power amplifier (PA) is an amplification device used to boost high S/N ratio signals prior to radio transmission, the PA (power amplifier), can be a linear PA or non-linear PA. "Linear PA" generally refers to a PA which operates at constant gain and needs to preserve amplitude information, while "Non-linear PA" generally refers to a PA designed to operate with constant PIN, where output power can be varied by changing gain.

In certain exemplary implementations, via hole spanning the multilayered AME, across all the layers, e.g., from the apical external layer to the external basal layer (e.g., "the Z-direction"), is referred to as a "through-hole via", which can be plated or filled (with a conductive metal used, for example, silver, copper, gold, aluminum, nickel, etc.), while via hole initiating at either the apical external layer, or the basal external layer; and terminate at any intermediate layer, is referred to as a "blind via"; and via hole between any two intermediate layers (regardless of being adjacent to each other), is referred to as a "buried via". Accordingly, and in an exemplary implementation upon curing and/or sintering the final layer, slots 301$i$, forming at least one of: first and/or second buried waveguides 101, 105 (respectively) and buried PA waveguide 107, and buried LNA waveguides 108 are filled buried vias. Additionally or alternatively, in another exemplary implementation and upon curing and/or sintering the final layer, at least one of: first and/or second buried waveguides 101, 105 (respectively) and buried PA waveguide 107, and buried LNA waveguides 108 are fully coaxial. Therefore, and in yet another exemplary implementation, upon curing and/or sintering the final layer, second waveguide is in communication with a buried LNA waveguide, the buried LNA waveguide coupled between the second waveguide and the LNA (referring to an amplifier whose input is connected, or intended to be connected, either directly or indirectly, to a receiving antenna, having a noise level equal to or less than that of the low cut filter).

The strip line junction circulators used in the RF and/or MMW AMEs fabricated using the methods disclosed refers to a circulator of 3-port (based on cancellation of waves propagating over two different paths near a magnetized material), or 4-port (e.g., based on Faraday rotation of waves propagating in a magnetized material) device formed by a symmetrical Y-Junction strip line coupled to a magnetically biased ferrite material. The circulator can be a ferrite containing circulator, or a non-ferrite circulator. The term "ferrite-containing circulator" is used herein to represent a magnetic ferrite element with at least three ports that allows radio frequency signals to be transferred between adjacent ports only in one direction, in other words, a diode. In certain exemplary implementations, the multilayered RF and/or MMW AME can be printed in a semi continuous manner, where initially, a cavity is formed with the appropriate contacts and the basal matching plate 116', while the circulator can be inserted and connected, followed by printing of the apical matching plate 116 and the apical radiating antenna elements 104.

While reference is made to inkjet inks and their dispensing systems, other additive manufacturing (AM) methods are also contemplated in the implementation of the disclosed methods. In the exemplary implementation, the RF and/or MMW AME can likewise be fabricated by a selective laser sintering (SLS) process, although any other suitable additive manufacturing process (also known as rapid prototyping, rapid manufacturing, and 3D printing methods) may also be used, either alone or in combination. These can be, for example, direct metal laser sintering (DMLS), electron beam melting (EBM), selective heat sintering (SHS), or stereolithography (SLA).

The RF and/or MMW AME antennae may be fabricated from any suitable additive manufacturing material, such as metal powder(s) (e.g., silver, gold, cobalt chrome, steels, aluminum, titanium and/or nickel alloys), gas atomized metal powder(s), thermoplastic powder(s) (e.g., polylactic acid (PLA), acrylonitrile butadiene styrene (ABS), and/or high-density polyethylene (HDPE)), photopolymer resin(s) (e.g., UV-curable photopolymers such as, for example PMMA), thermoset resin(s), thermoplastic resin(s), or any other suitable material that enables the functionality as described herein.

Depending on the metal particles' type (e.g., silver, copper, gold, aluminum, etc.) and aspect ratio (referring to the ratio between the metal particle's length and its respective thickness or diameter), in conductive ink compositions used for inkjet printing, maximum theoretical conductivity attainable may be a fraction of the same metal's bulk conductivity, for example, between about 10% and about 90%, or between about 20% and about 80%, or, in yet another example, between about 30% and about 70%, or 50%, when compared to pure bulk metal.

For example, the conductive material used to form radiating elements 104, 104' and/or (micro) transmission lines 110, 112 is a silver nanoparticle. In the context of the disclosure, nanoparticles are defined as particles with a volume average particle size ($D_{3,2}$, which can be central to obtaining the proper aspect ratio, in other words, R>>1, for example between 3:1 and 10:1), below 1 micrometer, for example below about 0.5 micrometer, or below about 0.2 micrometer. Nanoparticles may be advantageous for ink jet printing applications, enabling low ink viscosities even with a very high conductive material content or loading (thus ensuring exceeding the 2D and 3D site percolation thresholds), as well as preventing clogging of nozzles on the inkjet print-head dispenser.

In an exemplary implementation, the term "dispensing", in the context of the print heads used for fabricating the RF and/or MMW AME antennae disclosed herein, can be used to designate the operation of the device from which the ink drops are dispensed, such as the print head acting as a dispenser. The dispenser can be, for example an apparatus for dispensing small quantities of liquid including microvalves, piezoelectric dispensers, continuous-jet print-heads, boiling (bubble-jet) dispensers, and others affecting the temperature and properties of the fluid flowing through the dispenser. In an exemplary implementation, the term "print head" and the term "dispenser" are interchangeable.

The method of forming the RF and/or MMW AMEs using the computerized ink jet printing systems disclosed herein can comprise a step of providing a substrate (e.g., a peelable substrate such as a film). The print head (and derivatives thereof; are to be understood to refer to any device or technique that deposits, transfers or creates material on a surface in a controlled manner) depositing the dielectric ink, can be configured to provide the ink droplet(s) upon demand, in other words, as a function of various process parameters such as conveyor speed, desired AME sub-layer thickness, whether the via, is filled or plated, or their combination. It is noted, that radiating elements 104, 104' is (are) not disposed at the same thickness of the AME sub-layer determined by the process-specific sub-layer thickness, and can be disposed at the same or variable thickness as the sub-layer thickness.

The substrate, used in the computerized ink jet printing systems disclosed herein can be, for example removable or peelable, can also be a relatively rigid material, for example, glass or crystal (e.g., sapphire), Alternatively, the substrate may be a flexible (e.g., rollable) substrate (or film) to allow for an easy peeling of the substrate from the AME, for example, poly(ethylenenaphthalate) (PEN), polyimide (e.g. KAPTONE® by DuPont), silicon polymers, poly(ethyleneterphtalate) (PET), poly(tetrafluoroethylene) (PTFE) films etc.

Other functional steps (and therefore means for affecting these steps) may be taken when using the computerized ink jet printing systems disclosed herein before or after the first or second print heads (e.g., for sintering the conductive layer). These steps may include (but not limited to): a heating step (affected by a heating element such as a chuck, and/or hot air); photobleaching (using e.g., a UV light source and a photo mask); drying (e.g., using vacuum region, or heating element); (reactive) plasma deposition (e.g., using pressurized plasma gun and a plasma beam controller); cross linking (e.g., by selectively initiated through the addition of a photoacid such as {4-[(2-hydroxytetradecyl)-oxyl]-phenyl}-phenyliodonium hexafluoro antimonate to a polymer solutions prior to coating or used as dispersant with the metal precursor or nanoparticles); annealing, or facilitating redox reactions.

Formulating the conductive and/or dielectric ink composition(s), when using the computerized ink jet printing systems disclosed herein may take into account the requirements, if any, imposed by the deposition tool and the surface characteristics (e.g., at least one of hydrophilic or hydrophobic, and the surface energy) of the (optionally removable) substrate. Using ink-jet printing with a piezo head for example, the viscosity of either the conductive ink and/or dielectric ink (measured at 20° C.) can be, for example, not lower than about 5 cP, e.g., not lower than about 8 cP, or not lower than about 10 cP, and not higher than about 30 cP, e.g., not higher than about 20 cP, or not higher than about 15 cP. The conductive ink, and/or dielectric ink can each be configured (e.g., formulated) to have a dynamic surface tension (referring to a surface tension when an ink-jet ink droplet is formed at the print-head aperture) of between about 25 mN/m and about 35 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate or the dielectric layer(s) of between about 100° and about 165°.

In an exemplary implementation, the ink-jet ink systems compositions and methods for forming RF and/or MMW AME, can be patterned by expelling droplets of the liquid ink-jet ink provided herein from an orifice one-at-a-time, as the print-head (or the substrate/chuck) is maneuvered, for example in two (X-Y) (it should be understood that the print head can also move in the Z axis) dimensions at a predetermined distance above the substrate or any subsequent layer. The ink-jet print heads provided used in the methods described herein can provide a minimum layer film thickness equal to or less than about 3 µm-10,000 µm In an exemplary implementation, the volume of each droplet of the conductive ink, and/or the dielectric ink, can range from 0.5 to 300 picoLiter (pL), for example 1-4 pL and depended on the strength of the driving pulse and the properties of the ink. The waveform to expel a single droplet can be a 10V to about 70 V pulse, or about 16V to about 20V, and can be expelled at frequencies between about 5 kHz and about 500 KHz.

The dielectric ink compositions described herein can have in addition, a continuous phase comprising: a cross-linking agent, a co-monomer, a co-oligomer, co-polymer or a composition comprising one or more of the foregoing. Likewise, the oligomer and/or polymer backbone can be induced to form cross links by contacting the polymer with an agent that will form free radicals on the backbone, thereby allowing for cross-linking sites. In an exemplary implementation, the cross-linking agent, co-monomer, co-oligomer, co-polymer or a composition comprising one or more of the foregoing can be a part, or configured to form a solution, emulsion, gel or suspension within the continuous phase.

In an exemplary implementation, the continuous phase used in the AMEs (FPCs and HDI circuits) fabricated using the disclosed methods for forming a multilayer AME having reconfigurable and/or tunable antennae array, can comprise: multifunctional acrylate monomer, oligomer, polymer or their combination; a cross-linking agent; and a radical photoinitiator, and can be partially or entirely soluble in the continuous phase.

Initiating the dielectric resin backbone polymerization can be done using an initiator, for example benzoyl peroxide (BP) and other peroxide-containing compounds. The term "initiator" as used herein generally refers to a substance that initiates a chemical reaction, specifically any compound which initiates polymerization, or produces a reactive species which initiates polymerization, including, for example and without limitation, co-initiators and/or photoinitiator(s).

In another exemplary implementation, the dielectric resin used in the ink compositions described, comprises active and/or live components of a polymer capable of undergoing photoinitiation using a photoinitiator. Such live monomer, live oligomer, live polymer or their combination capable of undergoing photoinitiation can be for example, multifunctional acrylates, for example a multifunctional acrylate that can be multifunctional acrylate is selected from the group consisting of 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl) isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate.

Photoinitiators that can be used with the multifunctional acrylates described herein can be, for example radical photoinitiator. These radical photoinitiators can be, for example Irgacure® 500 from CIBA SPECIALTY CHEMICAL and Darocur® 1173, Irgacure® 819, Irgacure® 184, TPO-L (ethyl(2,4,6, trimethyl benzoil)phenyl phosphinate) benzophenone and acetophenone compounds and the like. For example, the radical photoinitiator can be cationic photoinitiator, such as mixed triarylsulfonium hexafluoroantimonate salts. Another example of the radical photoinitiator used in the active continuous phase described herein, can be 2-isopropylthioxanthone.

The terms "live monomer", "live oligomer", "polymer" or their counterparts (co-monomer e.g.,) combination refers in an exemplary implementation to a monomer, a short group of monomers or a polymer having at least one functional group capable of forming a radical reaction (in other words, the reaction can be continued and is not otherwise terminated by an end-group).

The cross-linking agent used in the compositions, systems and methods described herein, for forming RF and/or MMW AME, can be, for example, a primary or secondary polyamine and adducts thereof, or in another example, an anhydride, a polyamide, a $C_4$-$C_{30}$ polyoxyalkylene in which the alkylene groups each independently comprise 2 to 6 carbon atoms, or a composition comprising one or more of the foregoing.

The conductive and/or the dielectric ink compositions, may each require the presence of a surfactant and optionally a cosurfactants. The surfactants and/or cosurfactants may be cationic surfactants, anionic surfactants, non-ionic surfactant and amphiphilic copolymers, such as block copolymers.

Moreover, the dielectric (insulating) layer portion can have a substantially uniform thickness throughout, thereby creating a substantially planar (e.g., flat) surface for receiving an additional conductive circuit pattern. The dielectric layer may be an UV curable adhesive or other polymer material. For example, the dielectric ink comprises a UV curable polymer. Other dielectric polymers such as, for example, polyester (PES), polyethylene (PE), polyvinyl alcohol (PVOH) and poly-methyl methacrylate (PMMA), Poly(vinylpirrolidone) (PVP, water soluble and may be beneficial not to clog the print head orifice). Other dielectric materials can be photoresistive polymers, for example, SU-8 based polymers, polymer-derived ceramics or their combination and copolymers can also be used.

In an exemplary implementation, the step of curing is separate and distinct from the step of sintering. Accordingly, curing is affected by exposing the printed dielectric pattern to electromagnetic radiation in a predetermined wavelength of between about 196 nm and about 400 nm, for example, between about 300 nm and about 400 nm, or between about 350 nm and about 380 nm. Conversely, sintering is affected by exposing the conductive pattern printed to a focused heat source, such as for example, an IR focused lamp, or a laser beam operable to follow the conductive pattern.

The ink-jet systems used to implement the methods provided herein, can further comprises a computer aided manufacturing ("CAM") module, the module comprising a data processor, a non-volatile memory, and a set of executable instructions stored on the non-volatile memory, which, when executed are configured to cause at least one processor to: receive a 3D visualization file representing the printed circuit board comprising the infrastructure elements; generate a library of files, each file represents at least one, substantially 2D layer for printing the RF and/or MMW AME, creating a substantially 2D representation image; receive a selection of parameters related to the RF and/or MMW AME, wherein the CAM module is configured to control each of the first and second print heads. Accordingly, the set of executable instructions are further configured, when executed to cause the processor to generate a library of a plurality of subsequent layers' files from the 3D visualization file. Each subsequent file represents a substantially two dimensional (2D) subsequent layer for printing a subsequent portion of RF and/or MMW AME, wherein each subsequent layer file is indexed by printing order. Furthermore, the set of executable instructions can be configured to parse out the conductive and dielectric portions of each 2D layer, and create a unique pattern per each layer from the first and on, that will instruct the proper print head to print that portion of the 2D layer.

The CAM module can therefore comprise: a 2D file library storing the files converted from the 3D visualization files of the reconfigurable and/or tunable antennae. The term "library, as used herein, refers to the collection of 2D layer files derived from the 3D visualization file, containing the information necessary to print each conductive and dielectric pattern, which is accessible and used by the data collection application, which can be executed by the computer-readable media. The CAM further comprises a processor in communication with the library; a non-transitory storage device storing a set of operational instructions for execution by the processor; a micromechanical inkjet print head or heads in communication with the processor and with the library; and a print head (or, heads') interface circuit in communication with the 2D file library, the non-transitory storage device and the micromechanical inkjet print head or heads, the 2D file library configured to provide operation parameters to the printer, specific to a functional (printed) layer.

In certain exemplary implementations, the library comprises files representative of dielectric patterns only, conductive patterns only (for example, for formation of ground intermediate layer e.g., 302, 303 FIG. 3), or a layer file comprising both dielectric and conductive patterns. In layers comprising both dielectric and conductive patterns, the metafile created by the program included with the system, stored on the memory storage device, will further prioritize which pattern will be printed first and the curing or sintering sequence.

The 3D visualization file representing the multilayered PCB having reconfigurable and/or tunable antennae array, can be: an an ODB, an ODB++, an.asm, an STL, an IGES, a STEP, a Catia, a SolidWorks, a Autocad, a Creo, a 3D Studio, a Gerber, a Rhino a Altium, an Orcad, an or a file comprising one or more of the foregoing; and wherein file that represents at least one, substantially 2D layer (and uploaded to the library) can be, for example, a JPEG, a GIF, a TIFF, a BMP, a PDF file, or a combination comprising one or more of the foregoing.

In addition, the computer program, can comprise program code means for carrying out the steps of the methods described herein, as well as a computer program product comprising program code means stored on a medium that can be read by a computer. Non-transitory storage device(s) as used in the methods described herein can be any of various types of non-volatile memory devices or storage devices (in other words, memory devices that do not lose the information thereon in the absence of power). The term "memory device" is intended to encompass an installation medium, e.g., a CD-ROM, floppy disks, or tape device or a non-volatile memory such as a magnetic media, e.g., a hard drive, optical storage, or ROM, EPROM, FLASH, etc. The memory device may comprise other types of memory as well, or combinations thereof. In addition, the memory medium may be located in a first computer in which the programs are executed (e.g., the 3D inkjet printer provided), and/or may be located in a second different computer which connects to the first computer over a network, such as the Internet. In the latter instance, the second computer may further provide program instructions to the first computer for execution. The term "memory device" can also include two or more memory devices which may reside in different locations, e.g., in different computers that are connected over a network. Accordingly, for example, the bitmap library can reside on a memory device that is remote from the CAM module coupled to the 3D inkjet printer provided, and be accessible by the 3D inkjet printer provided (for example, by a wide area network)

The use of the term "module" does not imply that the components or functionality described or claimed as part of the module are all configured in a (single) common package. Indeed, any or all of the various components of a module, whether control logic or other components, can be combined in a single package or separately maintained and can further be distributed in multiple groupings or packages or across multiple (remote) locations and devices. Furthermore, in certain exemplary implementations, the term "module" refers to a monolithic or distributed hardware unit.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

Unless specifically stated otherwise, as apparent from the following discussions, it is appreciated that throughout the specification discussions utilizing terms such as "processing," "loading," "in communication," "detecting," "calculating," "determining", "analyzing," or the like, refer to the action and/or processes of a computer or computing system, or similar electronic computing device, that manipulate and/or transform data represented as physical, such as a transistor architecture into other data similarly represented as physical structural (in other words, resin or metal/metallic) layers.

In the context of the disclosure, the term "operable" means the system and/or the device and/or the program, or a certain element or step is fully functional, sized, adapted and calibrated, comprises elements for, and meets applicable operability requirements to perform a recited function when activated, coupled, implemented, actuated, effected, realized, or when an executable program is executed by at least one processor associated with the system and/or the device. In relation to systems and circuits, the term "operable" means the system and/or the circuit is fully functional and calibrated, comprises logic for, having the hardware and firmware necessary, as well as the circuitry for, and meets applicable operability requirements to perform a recited function when executed by at least one processor.

The Computer-Aided Design/Computer-Aided Manufacturing (CAD/CAM) generated information associated with the AME including built-in passive and embedded active components described herein to be fabricated, which is used in the methods, programs and libraries can be based on converted CAD/CAM data packages can be, for example, IGES, DXF, DWG, DMIS, NC files, GERBER® files, EXCELLON®, STL, EPRT files, an ODB, an ODB++, an.asm, an STL, an IGES, a STEP, a Catia, a SolidWorks, a Autocad, a ProE, a 3D Studio, a Gerber, a Rhino a Altium, an Orcad, an Eagle file or a package comprising one or more of the foregoing. Additionally, attributes attached to the graphics objects transfer the meta-information needed for fabrication and can precisely define the PCBs. Accordingly and in an exemplary implementation, using pre-processing algorithm, GERBER®, EXCELLON®, DWG, DXF, STL, EPRT ASM, and the like as described herein, are converted to 2D files.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the element (s) includes one or more element).

Reference throughout the specification to "one exemplary implementation", "another exemplary implementation", "an exemplary implementation", and so forth, when present, means that a particular element (e.g., feature, structure, and/or characteristic) described in connection with the exemplary implementation is included in at least one exemplary implementation described herein, and may or may not be present in other exemplary implementations. In addition, it is to be understood that the described elements may be combined in any suitable manner in the various exemplary implementations.

All ranges disclosed herein are inclusive of the endpoints, and the endpoints are independently combinable with each other. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Accordingly, and in an exemplary implementation, provided herein is a method of fabricating at least one of a radio-frequency (RF), and a mmWave circuits comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") module, in communication with each of the first, and second print heads, the CAM module comprising a central processing module (CPM), the CPM further comprising: at least one processor in communication with a non-transitory computer readable storage device configured to store instructions that, when executed by the at least one processor cause the CPM to control the ink-jet printing system, by carrying out steps that comprise: receiving a 3D visualization file representing the frequency pass filter (FPF); and generating a file library having a plurality of files, each file representing a substantially 2D layer for printing the at least one of: the RF, and the mmWave circuits, and a metafile representing at least the printing order; providing the dielectric ink composition, and the conductive ink composition; using the CAM module, obtaining from the library a first file representative of the first layer for printing the at least one of: the RF, and the mmWave circuits; the first file comprising printing instructions for a pattern representative of at least one of: the dielectric ink, and the conductive ink; using the first print head, forming the pattern corresponding to the dielectric ink; curing the pattern corresponding to the dielectric ink representation in the 2D layer of the multilayer PCB; using the second print head, forming the pattern corresponding to the conductive ink; sintering the pattern corresponding to the conductive ink; using the CAM module, obtaining from the a subsequent file representative of a subsequent layer for printing the at least one of: the RF, and the mmWave circuits; the subsequent file comprising printing instructions for a pattern representative of at least one of: the dielectric ink, and the conductive ink; repeating the steps of: using the first print head, forming the pattern corresponding to the dielectric ink, to the step of using the CAM module, obtaining from the 2D file library the subsequent, substantially 2D layer, wherein upon curing and/or sintering the final layer, at least one of: the RF, and the mmWave circuits comprises: a first buried waveguide in communication with a power amplifier (PA); a buried selector in communication with the first buried wave guide; an antenna, in communication with the selector; a second buried waveguide in communication with the selector; and a low noise amplifier (LNA) in communication with the second buried waveguide; and removing the substrate, wherein (i) in the step of generating a file library having a plurality of files, the set of executable instructions, when executed, further comprise: for each substantially 2D layer, generating a file comprising a dielectric ink pattern for printing; for each of the generated dielectric ink pattern, generating a sub-library of a plurality of files comprising a conductive ink pattern; for each file comprising the conductive ink pattern, generating a metafile comprising at least a printing order; and for each file comprising the dielectric ink pattern, generating a metafile comprising at least the printing order, (ii) the number of files in the sub-library comprising the plurality of substantially 2D layer files of conductive ink pattern for printing each substantially 2D layer file of the dielectric ink pattern, is configured, upon sintering the last substantially 2D layer of the printed conductive ink pattern, to have the same thickness as the cured printed dielectric ink pattern, (iii) or, the number of files in the sub-library comprising the plurality of substantially 2D layer files of conductive ink pattern for printing each substantially 2D layer file of the dielectric ink pattern, is configured, upon sintering the last substantially 2D layer of the printed conductive ink pattern, to have a different thickness or height than the thickness or height of the cured printed dielectric ink pattern, (iv) the pattern in each file in the sub-library of substantially 2D layer files for printing the conductive ink pattern, is identical, or (v) at least one file in the sub-library of substantially 2D layer files for printing the conductive ink pattern, has conductive ink pattern that is different from the conductive ink pattern in at least another file in the sub-library, wherein (vi) the circuit is a RF circuit, (vii) upon curing and/or sintering the final layer, the antenna in the RF circuits is an antenna array, wherein (viii) upon curing and/or sintering the final layer, the at least one of: the first, and second buried waveguides is a Post-wall waveguide, and/or a full coaxial waveguide, while (ix), the antenna array is at least one of: a slot array antenna, and a patch array antenna, wherein, (x) upon curing and/or sintering the final layer, the first waveguide is in communication with a buried power amplifier (PA) waveguide, the buried PA waveguide being coupled between the first waveguide and the PA, (xi) upon curing and/or sintering the final layer, the slots forming the at least one of: the first buried waveguide and the buried PA waveguide are filled buried vias, wherein (xii) upon curing and/or sintering the final layer, the buried PA waveguide is a full coaxial waveguide, and/or a twisted waveguide, wherein (xiii) upon curing and/or sintering the final layer, the second buried waveguide is in communication with a buried low-noise amplifier (LNA) waveguide, the buried LNA waveguide coupled between the second buried waveguide and the LNA, (xiv) wherein upon curing and/or sintering the final layer, the slots forming at least one of: the second buried waveguide and the LNA waveguide are filled buried vias, (xv) at least one of the second buried waveguide, and the LNA waveguide, is a full coaxial waveguide, wherein (xvi) upon curing and/or sintering the final layer, the buried PA waveguide is further coupled to a capacitor, in communication with a strip line connected to the PA, (xvii) the strip line is a micro strip line coupled to the capacitor by a blind via operable to provide a mode change, and wherein (xviii) wherein upon curing and/or sintering the final layer, the buried LNA waveguide is in communication with a strip line connected to the LNA by a via operable to provide a mode change.

The above examples and description have of course been provided only for the purpose of illustration, and are not intended to limit the disclosed technology in any way. As will be appreciated by the skilled person, the disclosed technology can be carried out in a great variety of ways, employing more than one technique from those described above, all without exceeding the scope of the invention.

What is claimed:

1. A method of fabricating radio-frequency (RF), and/or mmWave circuits comprising:
   a. providing an ink jet printing system comprising:
      i. a first print head, sized and configured to dispense a dielectric ink composition;
      ii. a second print head, sized and configured to dispense a conductive ink composition;
      iii. a conveyor, operably coupled to the first and the second print heads, configured to convey a substrate to each of the first and the second print heads; and
      iv. a computer aided manufacturing ("CAM") module, in communication with each of the first and the second print heads, the CAM module comprising a central processing module (CPM), the CPM further comprising: at least one processor in communication with a non-transitory computer readable storage device configured to store a set of executable instructions that, when executed by the at least one processor, cause the CPM to control the ink-jet printing system, by carrying out steps that comprise: receiving a 3D visualization file representing the radio-frequency (RF), and/or mmWave circuits; and generating a file library having a plurality of files, each file representing a substantially 2D layer for printing the RF and/or the mmWave circuits, and a metafile representing at least a printing order;
   b. providing the dielectric ink composition and the conductive ink composition;
   c. using the CAM module, obtaining from the file library a first file representative of a first layer for printing the RF and/or the mmWave circuits; the first file comprising printing instructions for a pattern representative the dielectric ink and/or the conductive ink;
   d. using the first print head, forming the pattern corresponding to the dielectric ink;

e. curing the pattern corresponding to the dielectric ink representation in the 2D layer of the radio-frequency (RF), and/or mmWave circuits;
f. using the second print head, forming the pattern corresponding to the conductive ink;
g. sintering the pattern corresponding to the conductive ink;
h. using the CAM module, obtaining from the file library a subsequent file representative of a subsequent layer for printing the RF and/or the mmWave circuits; the subsequent file comprising printing instructions for a pattern representative of the dielectric ink and/or the conductive ink;
i. repeating the steps of: using the first print head, forming the pattern corresponding to the dielectric ink, to the step of using the CAM module, obtaining from the file library the subsequent, substantially 2D layer, wherein upon curing and/or sintering a final layer, the RF and/or the mmWave circuits comprises:
   i. a first buried waveguide in communication with a power amplifier (PA);
   ii. a buried selector in communication with the first buried wave guide;
   iii. an antenna, in communication with the buried selector;
   iv. a second buried waveguide in communication with the buried selector; and
   v. a low noise amplifier (LNA) in communication with the second buried waveguide; and
j. removing the substrate.

2. The method of claim 1, wherein, in the step of generating the file library having a plurality of files, the set of executable instructions, when executed, further comprise:
   a. for each substantially 2D layer, generating a file comprising a dielectric ink pattern for printing;
   b. for each of the generated dielectric ink patterns, generating a sub-library of a plurality of files comprising a conductive ink pattern; and
   c. for each file comprising the conductive ink pattern, generating a metafile comprising at least a printing order.

3. The method of claim 2, wherein upon curing and/or sintering the final layer, the antenna in the RF circuits is an antenna array.

4. The method of claim 2, wherein upon curing and/or sintering the final layer, the at least one of the first and the second buried waveguides is a Post-wall waveguide and/or a full coaxial waveguide.

5. The method of claim 4, wherein upon curing and/or sintering the final layer, the antenna is a slot array antenna and/or a patch array antenna.

6. The method of claim 5, wherein upon curing and/or sintering the final layer, the first buried waveguide is in communication with a buried power amplifier (PA) waveguide, the buried PA waveguide being coupled between the first buried waveguide and the PA.

7. The method of any one of claim 6, wherein upon curing and/or sintering the final layer, slots forming at least one of the first buried waveguide and the buried PA waveguide are filled buried vias.

8. The method of claim 6, wherein upon curing and/or sintering the final layer, the buried PA waveguide is a full coaxial waveguide.

9. The method of claim 5, wherein upon curing and/or sintering the final layer, the second buried waveguide is in communication with a buried low-noise amplifier (LNA) waveguide, the buried LNA waveguide coupled between the second buried waveguide and the LNA.

10. The method of claim 9, wherein upon curing and/or sintering the final layer, slots forming at least one of the second buried waveguide and the LNA waveguide are filled buried vias.

11. The method of claim 9, wherein upon curing and/or sintering the final layer, at least one of the second buried waveguide and the LNA waveguide is a full coaxial waveguide.

12. The method of claim 6, wherein upon curing and/or sintering the final layer, the buried PA waveguide is further coupled to a capacitor, in communication with a strip line connected to the PA.

13. The method of claim 12, wherein upon curing and/or sintering the final layer, the strip line is a micro strip line coupled to the capacitor by a blind via operable to provide a mode change.

14. The method of claim 9, wherein upon curing and/or sintering the final layer, the buried LNA waveguide is in communication with a strip line connected to the LNA by a via operable to provide a mode change.

15. The method of claim 2, wherein at least one file in the sub-library of substantially 2D layer files for printing the conductive ink pattern, has a conductive ink pattern that is different from the conductive ink pattern in at least another file in the sub-library.

* * * * *